United States Patent
Trincia et al.

(10) Patent No.: US 12,127,651 B1
(45) Date of Patent: Oct. 29, 2024

(54) ITEMS WITH HIDDEN MAGNETS

(71) Applicant: Apple Inc., Cupertino, CA (US)

(72) Inventors: Nicholas R. Trincia, San Francisco, CA (US); Chihchen Sun, Shenzhen (CN); Qigen Ji, Fairfield, CA (US); Yang Zhou, Sunnyvale, CA (US); Jenna L. Withrow, San Francisco, CA (US); Jack Pickup, Shenzhen (CN); Joshua A. Hoover, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 751 days.

(21) Appl. No.: 16/919,000

(22) Filed: Jul. 1, 2020

(51) Int. Cl.
*H01F 7/00* (2006.01)
*A45C 11/00* (2006.01)
*A45C 13/10* (2006.01)
*H01F 7/02* (2006.01)
*H04R 1/10* (2006.01)
*H05K 5/03* (2006.01)

(52) U.S. Cl.
CPC ......... *A45C 13/1069* (2013.01); *A45C 11/00* (2013.01); *H01F 7/02* (2013.01); *H04R 1/1091* (2013.01); *H05K 5/03* (2013.01); *A45C 2011/001* (2013.01)

(58) Field of Classification Search
CPC .............................. A45C 11/00; A45C 13/1069
See application file for complete search history.

(56) References Cited

U.S. PATENT DOCUMENTS

| | | | | |
|---|---|---|---|---|
| 2,959,832 A | * | 11/1960 | Baermann | A45C 13/1069 49/478.1 |
| 3,827,019 A | * | 7/1974 | Serbu | A41F 1/002 135/117 |
| 4,399,595 A | * | 8/1983 | Yoon | A41F 1/002 24/303 |
| 5,104,076 A | * | 4/1992 | Goodall, Jr. | A45F 5/14 248/205.2 |
| 5,604,960 A | * | 2/1997 | Good | A41F 1/002 24/66.1 |
| 5,682,653 A | * | 11/1997 | Berglof | G09F 1/10 224/183 |
| 6,476,113 B1 | * | 11/2002 | Hiles | B32B 25/08 524/436 |
| 7,154,363 B2 | * | 12/2006 | Hunts | H01F 7/0242 446/92 |
| 8,187,006 B2 | | 5/2012 | Rudisill et al. | |
| 8,662,298 B2 | * | 3/2014 | Aldana | A45C 11/00 206/320 |
| 8,727,914 B2 | * | 5/2014 | Sells | A63B 69/0002 224/607 |

(Continued)

*Primary Examiner* — Jason W San
(74) *Attorney, Agent, or Firm* — Treyz Law Group, P.C.; Tianyi He

(57) ABSTRACT

Items such as enclosures may be provided with hidden magnets. An enclosure may be formed from a flexible housing layer. The flexible housing layer may be configured to open and close by folding around fold axes. Portions of the flexible layer may include a flexible base layer with openings. Flexible magnets may be embedded within the openings. The flexible magnets may be used in forming a magnetic clasp for the enclosure. The flexible magnets may each have a height and durometer value that closely matches the height and durometer value of an adjacent portion of the flexible base layer, thereby helping to hide the flexible magnets within the housing layer.

19 Claims, 8 Drawing Sheets

(56) References Cited

U.S. PATENT DOCUMENTS

| Patent/Publication No. | Date | Name | Classification |
|---|---|---|---|
| 9,049,911 B1* | 6/2015 | Wood | A45C 11/00 |
| 9,055,791 B2* | 6/2015 | Proud | G16H 15/00 |
| 9,926,953 B2* | 3/2018 | Russell-Clarke | A44B 17/0005 |
| 9,966,174 B2* | 5/2018 | Naftali | H01F 7/0215 |
| 10,993,339 B2* | 4/2021 | Mayfield | A44B 18/0073 |
| 11,369,158 B2* | 6/2022 | Graves | A45F 5/021 |
| 11,381,892 B1* | 7/2022 | Scales | A45C 13/1069 |
| 11,606,873 B2* | 3/2023 | Mayfield | A45F 5/02 |
| 11,696,634 B2* | 7/2023 | Schori | A45F 5/02 224/183 |
| 2003/0029006 A1* | 2/2003 | Pelt | A45F 5/06 24/442 |
| 2005/0102802 A1* | 5/2005 | Sitbon | A45C 13/1069 24/303 |
| 2006/0006969 A1* | 1/2006 | Cassar | B23Q 3/1546 335/306 |
| 2009/0014105 A1* | 1/2009 | Shattuck | A45F 5/02 224/183 |
| 2009/0211533 A1* | 8/2009 | Sprung | B24D 15/00 51/297 |
| 2010/0197148 A1* | 8/2010 | Rudisill | H01R 13/6205 439/40 |
| 2010/0275419 A1* | 11/2010 | Millus | A47G 21/167 24/306 |
| 2011/0252609 A1* | 10/2011 | Rothbaum | H04M 1/15 24/305 |
| 2011/0253571 A1* | 10/2011 | Rothbaum | H04R 1/1033 156/60 |
| 2012/0216374 A1* | 8/2012 | Manuello | A41F 1/002 24/303 |
| 2014/0069791 A1 | 3/2014 | Chu et al. | |
| 2014/0245790 A1* | 9/2014 | Proud | A61B 5/681 63/1.13 |
| 2016/0135575 A1* | 5/2016 | Solomon | A45F 5/02 224/235 |
| 2018/0322992 A1* | 11/2018 | Naftali | A45C 13/1069 |
| 2019/0075869 A1* | 3/2019 | Smith, IV | A45C 3/00 |
| 2019/0110566 A1* | 4/2019 | Hatanaka | H04M 1/185 |
| 2019/0208878 A1* | 7/2019 | Hynecek | H04M 1/04 |
| 2020/0305528 A1* | 10/2020 | Graves | A45F 5/021 |
| 2021/0085047 A1* | 3/2021 | Wright | A45C 13/02 |
| 2021/0345742 A1* | 11/2021 | Wright | A45F 5/021 |
| 2022/0166456 A1* | 5/2022 | Dannenberg | H04B 1/3888 |

* cited by examiner

ITEMS WITH HIDDEN MAGNETS

FIELD

This relates generally to magnets, and, more particularly, to items with hidden magnets.

BACKGROUND

Items such as removable covers and other enclosures may have magnets. For example, magnets may be used to form magnetic clasps.

SUMMARY

Items such as enclosures may be provided with hidden magnets. An enclosure may be used to receive and store an electronic device such as a pair of headphones or other electronic equipment.

An enclosure may be formed from a flexible housing layer. The flexible housing layer may be configured to open and close by folding around fold axes. For example, the flexible housing may have flaps that fold along three respective axes to enclose and cover a pair of headphones or other electronic device.

The flexible housing layer may include a flexible base layer with openings. The openings may be circular openings or openings of other shapes. Flexible magnets may be embedded within the openings. In an illustrative configuration, the flexible base layer and the flexible magnets may be formed from thermoset polymer that is compressed and heated between mating plates in a tool, thereby curing the polymer and forming a unitary flexible layer with embedded magnets. Covering layers may be attached with adhesive to opposing sides of the flexible base layer with embedded magnets.

The flexible magnets may be used in forming a magnetic clasp for the enclosure. The magnetic clasp may, for example, be used to hold down a flap of the flexible housing layer. To hide the flexible magnets within the housing layer and thereby enhance the appearance of the enclosure, the flexible magnets may have heights and durometer values that closely match the height and durometer value of adjacent portions of the flexible base layer.

DETAILED DESCRIPTION

Items such as enclosures and other items may be provided with magnets. For example, an enclosure may be provided with one or more magnets to form a magnetic clasp or other magnetic closure. A magnetic clasp may allow the enclosure to be opened to receive an electronic device or other contents and may be closed when it is desired to store the device or other contents in the interior of the enclosure.

In general, any suitable items may be provided with magnets. These items may include, for example, items of furniture, items of clothing, structures in embedded systems such as vehicles (e.g., compartments in vehicles), wrist straps for wristwatches, head straps for head-mounted devices, armbands and other wearable items, and/or other items. Configurations in which items such as enclosures are provided with magnets may sometimes be described herein as examples.

Examples of enclosures that may be provided with magnets such as magnets for clasps or other closures include handbags, wallets, backpacks, removable covers (sometimes referred to as cases) for electronic devices, covers for other equipment, and/or other enclosures for receiving and storing items. Enclosures such as removable electronic devices covers with magnetic clasps may sometimes be described herein as an example.

Figure 1:
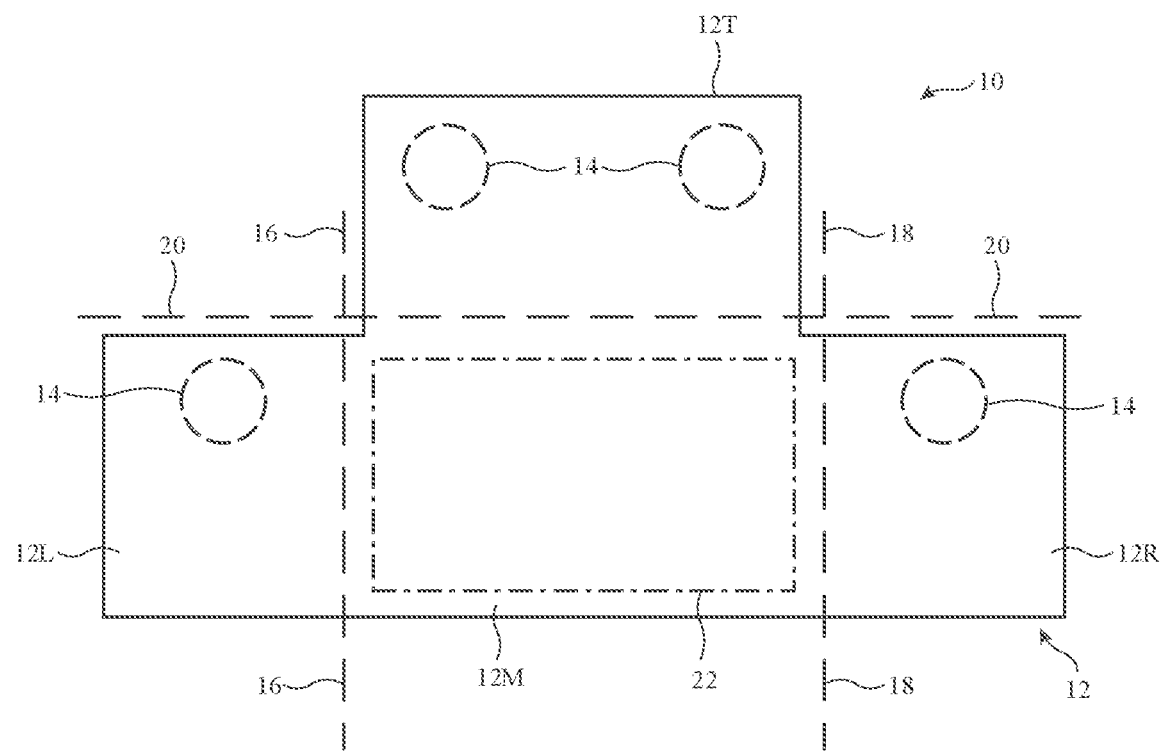
FIG. 1 is a top view of an illustrative item with magnets in accordance with an embodiment.

An illustrative enclosure is shown in FIG. 1. As shown in FIG. 1, enclosure 10 may be formed from a layer of material such as flexible layer 12. Layer 12 may have a main portion such as portion 12M, a left portion such as left portion 12L that folds over the left of portion 12M about fold axis 16, a right portion such as right portion 12R that folds over the right of portion 12M about fold axis 18, and a top portion such as top portion 12T that folds over main portion 12M about fold axis 20. Layer 12, which may sometimes be referred to as a housing wall, housing structure, enclosure wall, enclosure wall layer, enclosure housing, etc., may be formed from one or more flexible layers of material. Configurations in which enclosure 10 has rigid structures (e.g., a rigid internal frame member, rigid housing wall structures, etc.) may be used, if desired. Illustrative configurations in which enclosure 10 is formed from flexible layer 12 are described herein as an example.

Enclosure 10 is configured to receive and store contents such as electronic device 22. In the configuration of FIG. 1, enclosure 10 is in its open state in which portions 12L, 12R, and 12T are all unfolded to reveal electronic device 22. Electronic device 22 may be a pair of headphones, a cellular telephone, a tablet computer, a laptop computer, a head-mounted or other electronic equipment. Enclosures such as enclosure 10 may also be used to store and protect other items (e.g., non-electronic items). The use of enclosure 10 to store electronic equipment such as a portable electronic device is illustrative.

As shown in FIG. 1, enclosure 10 may include magnets 14. Magnets 14 may be used to form a magnetic clasp or other closure. In an illustrative configuration, magnets 14 on one portion of layer 12 attract corresponding magnets 14 on another portion of layer 12 when enclosure 10 is in its closed state.

Figure 2:
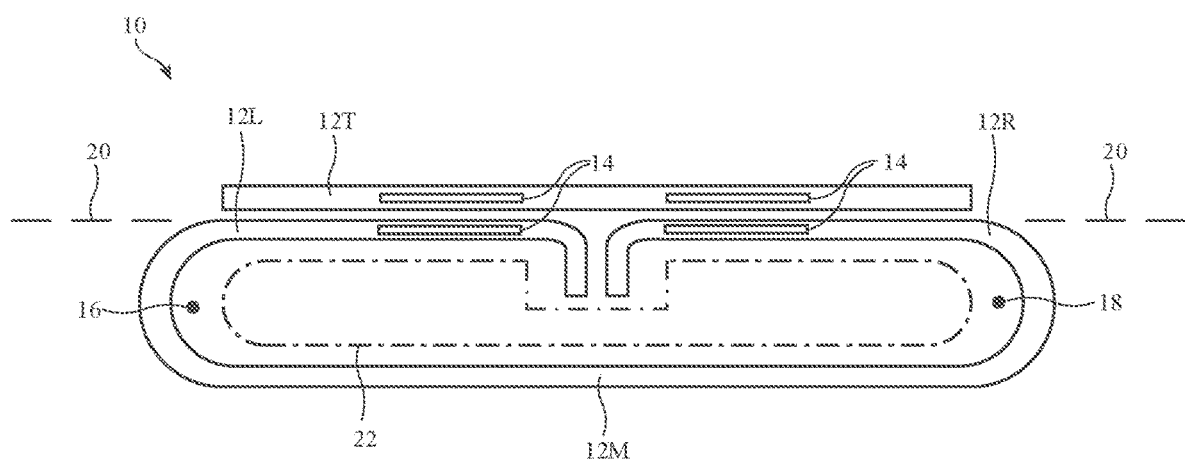
FIG. 2 is a cross-sectional front view of the illustrative item of FIG. 1 in accordance with an embodiment.

FIG. 2 is a cross-sectional side view of enclosure 10 in its closed state. As shown in FIG. 2, in its closed state, layer 12 is folded around device 22 to protect and store device 22. In particular, portion 12L may be folded to the right about axis 16 to cover a left portion of device 22 and main portion 12M. Portion 12R may be folded to the left about axis 18 to cover a right portion of device 22 and main portion 12M. After folding portions 12L and 12R closed in this way about axes 16 and 18, respectively, portion 12T may be folded about axis 20 to close enclosure 10 around device 22.

As the example of FIGS. 1 and 2 demonstrates, magnets 14 may form a magnetic closure for enclosure 10. In particular, a pair of magnets 14 in portion 12T may mate with corresponding magnets 14 in left portion 14L and right portion 14R to secure portion 12T on portions 12L and 12R and thereby help prevent enclosure 10 from inadvertently opening. In general, there may be any suitable number of magnets 14 in enclosure 10 (e.g., at least one, at least two, at least three, at least four, at least six, fewer than 20, fewer than ten, etc.). Magnets 14 may mate with other magnets (e.g., magnets with opposing poles) and/or magnets 14 may be magnetically attracted to non-magnetized magnetic material (e.g., non-magnetized ferromagnetic material such as non-magnetized iron). For example, a magnetic closure may be formed from a single magnet that is attracted to a non-magnetized iron bar. Configurations in which magnets 14 mate with corresponding magnets 14 may sometimes be described herein as an example.

It may be desirable to help visually and physically hide magnets 14. Physical hiding of magnets 14 (e.g., so that magnets 14 are not noticeable to the touch) may help enhance the way in which enclosure 10 feels when handled by a user. Visual hiding of magnets 14 may enhance the appearance of enclosure 10.

In configurations in which layer 12 is flexible to facilitate bending of portions of layer 12 about fold axes such as axes 16, 18, and 20, it may be desirable for magnets 14 to be flexible magnets. Configuring magnets 14 so that the flexibility of magnets 14 matches the flexibility of surrounding structures in enclosure 10 may help physically mask the presence of magnets 14 to the user and thereby make it feel as though layer 12 and/or other portions of enclosure 10 are formed from a single uniform structure, uninterrupted by magnets. For example, layer 14 may be formed from a soft flexible layer and magnets 14 may have a hardness that identically or closely matches the hardness of this soft flexible layer, thereby physically hiding the presence of magnets 14 from the user.

Figure 3:
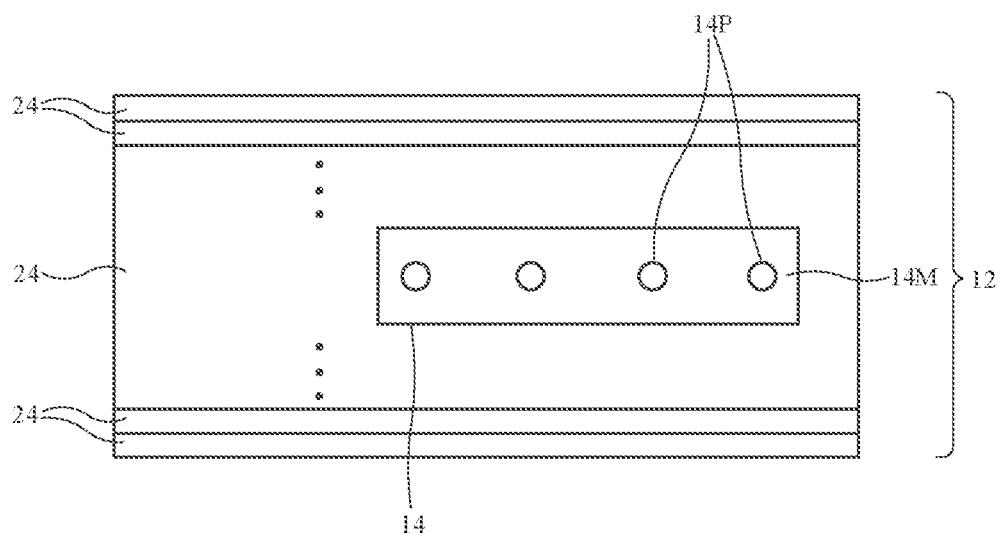
FIG. 3 is a cross-sectional side view of an illustrative layer with an embedded magnet in accordance with an embodiment.

To help hide magnets 14 from view and thereby enhance the appearance of enclosure 10, magnets 14 may embedded in layer 12. A cross-sectional side view of layer 12 in an illustrative configuration in which magnets 14 has been embedded in layer 12 is shown in FIG. 3. As shown in FIG. 3, magnets 14 may be formed from a layer of magnetic material having magnetic particles 14P embedded in a polymer binder or other matrix material such as matrix material 14M. Magnetic particles 14P may be formed from a magnetizable powder (e.g., a ferrite powder or a powder of other magnetic material, sometimes referred to as magnetic particle filler or magnetic filler). After embedding magnetic filler material such as particles 14P in matrix 14M, a strong external magnetic field is applied to magnetize particles 14P and thereby form a permanent magnetic structure for magnet 14.

The durometer (or elasticity) of the polymer making up magnets 14 may be identical or similar to the durometer (or elasticity) of surrounding materials in layer 12 to help physically hide the presence of magnets 14. As an example, magnet 14 may have a Shore A hardness of 90 and surrounding adjacent material in layer 14 may have a Shore A hardness of 60 (e.g., magnets 14 may have a durometer value or a modulus of elasticity value that varies by less than 50%, less than 30%, less than 15%, or other suitable amount relative to that of surrounding materials). These surrounding materials may include one or more sublayers of material such as layers 24. For example, layers 24 may include a layer of matching or nearly matching durometer hardness that is completely or partly coplanar with the layer of material from which magnets 14 are formed. Layers 24 may also include one or more additional layers such as adhesive layers, structural layers, protective films, cosmetic covering layers, etc. Layers 24 may be formed from polymer, fabric, metal, leather or other natural materials, bonded leather, glass, ceramic, etc. Adhesive layers, welds, fasteners such as rivets or screws, engagement structures such as snaps, and/or other attachment structures may be used in attaching layers 24 together.

If desired, magnets 14 may be cut (e.g., die cut, laser cut, etc.) from a layer of magnetic material (e.g., a layer of polymer matrix 14M in which magnetic filler such as magnetic particles 14P has been embedded). A mating layer of material for layer 14 (e.g., a coplanar layer of material) may be provided with mating openings. The openings may have the same size and shape as the shape of the magnets that have been cut from the layer of magnetic material, allowing these cut magnetic members to be received within the openings.

Figure 4:
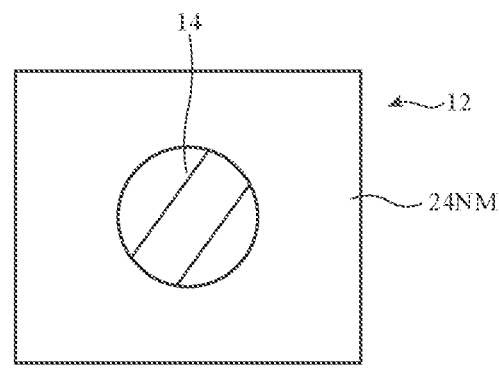
FIG. 4 is a top view of an illustrative magnet embedded in a layer of material in accordance with an embodiment.

Consider, as an example, the illustrative configuration of FIG. 4. As shown in FIG. 4, layer 12 may include magnet 14. In the example of FIG. 4, magnet 14 has a disk shape and has been die cut from a layer of polymer matrix 14M with embedded particles 14P. Other magnet shapes may be used, if desired. In the FIG. 4 arrangement, layer 12 includes layer 24NM (e.g., a polymer layer). Layer 24NM, which may sometimes be referred to as a base layer, a midlayer, a middle layer, a coplanar layer, an internal layer, a filler layer, a polymer layer, etc., may lie in a common plane with magnets 14 (e.g., magnets 14 may be fully or partly coplanar with layer 24NM and may be embedded within layer 24NM in layer 12). The thickness of layer 24NM (and of magnets 14) may be 0.6-2.4 mm, at least 0.3 mm, at least 0.5 mm, at least 0.7 mm at least 1.0 mm, 1.2 mm less than 4 mm, less than 3 mm, less than 1.8 mm, or less than 1.4 mm (as examples).

Layer 24NM may have a durometer value that matches or nearly matches the durometer value of magnet 14, thereby helping to physically hide magnet 14 within layer 24NM. In preparation for receiving the disk-shaped die-cut magnetic member that forms magnet 14, layer 24NM may be provided with openings of the same shape and size as the disks forming magnets 14 (e.g., layer 24NM may be provided with circular holes that are configured to receive magnets 14).

Figure 5:
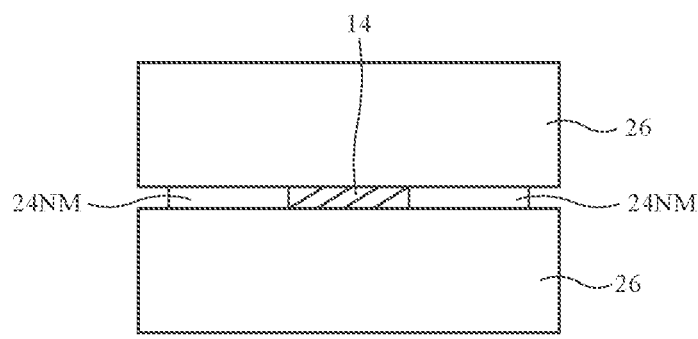
FIG. 5 is a cross-sectional side view of an illustrative magnet being embedded into a layer of material by a tool that is using upper and lower plates to apply pressure to the magnet and layer of material in accordance with an embodiment.

After inserting the disk-shaped magnetic members of matrix 14M and particles 14P, into the mating holes of layer 24NM, these structures may be compressed between heated tool members 26, as shown in FIG. 5. The polymer material making up matrix 14M may be the same material that makes up layer 24NM or may be a different material. Thermoset and/or thermoplastic polymer materials may be used. In an illustrative configuration, matrix 14M and layer 24NM are composed of uncured or partly cured thermoset polymer having a rubbery consistency. Thermoset materials may exhibit good reliability and a satisfactory hand feel. An Example of a thermoset material that may be used in forming layer 24NM and matrix 14M is nitrile-butadiene rubber (sometimes referred to nitrile rubber).

The process of applying heat and pressure with tool members 26 (e.g., heated metal plates) of FIG. 5, which may sometimes be referred to as top and bottom plates or mold dies, allows these two materials to soften and flow slightly into each other while curing. Following curing, a high strength magnetic field may be applied to magnets 14 to magnetize magnets 14 in a desired pattern. In this way a single integral layer of flexible polymer with an embedded flexible magnet (or multiple magnets) is formed.

To help hide magnets 14 within layer 12, there may be a minimal step height difference between magnet 14 and co-planar layer 24NM. For example, the difference in the height (thickness) between magnet 14 and layer 24NM may, in some configurations, be less than 0.1 mm, less than 0.05 mm, or less than 0.02 mm (as examples). Arrangements in which the step height difference is particularly small (e.g., less than 0.05 mm) may be preferred to help avoid creating a visible and physically detectable magnet-shaped outline on the surface of layer 14.

Figure 6:
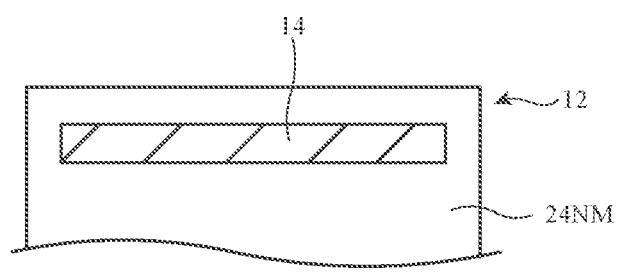
FIG. 6 is a top view of a portion of an illustrative layer with an elongated strip-shaped embedded magnet in accordance with an embodiment.

Magnets formed using the illustrative technique of FIG. 5 may have any suitable shape. As shown in FIG. 6, for example, elongated magnetic shapes such as elongated strip shapes may be used in forming magnet 14. In general, magnets 14 may have outlines with curved edges, straight edges, square shapes, rectangular shapes, triangular shapes, circular shapes, etc. The circular magnet shape of FIG. 4 and the strip-shaped magnet shape of FIG. 6 are illustrative.

Figure 7:
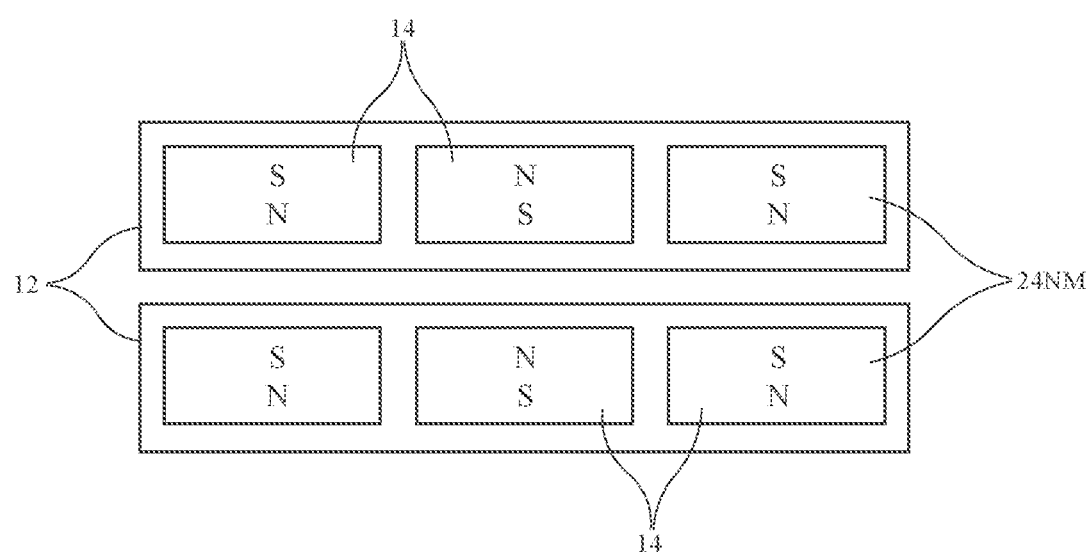
FIG. 7 is a cross-sectional side view of two layers in an item with mating magnets in accordance with an embodiment.

Mating magnets 14 may be configured to have opposing poles. For example, if a first half of a clasp is formed from a magnet with an exposed north pole, a second mating half of the clasp may be formed from a magnet with an opposing exposed south pole, so that the first and second halves of the clasp attract each other. If desired, a group of magnets 14 may be formed in layer 12, as shown in FIG. 7. These magnets may each have poles that oppose the poles of mating magnets in a magnetic closure. The magnetic poles of magnets 14 on one part of a closure may all be arranged in the same direction or, as shown in FIG. 7, an array of magnets 14 may have magnet poles arranged in an alternating pattern or other pattern.

Figure 8:
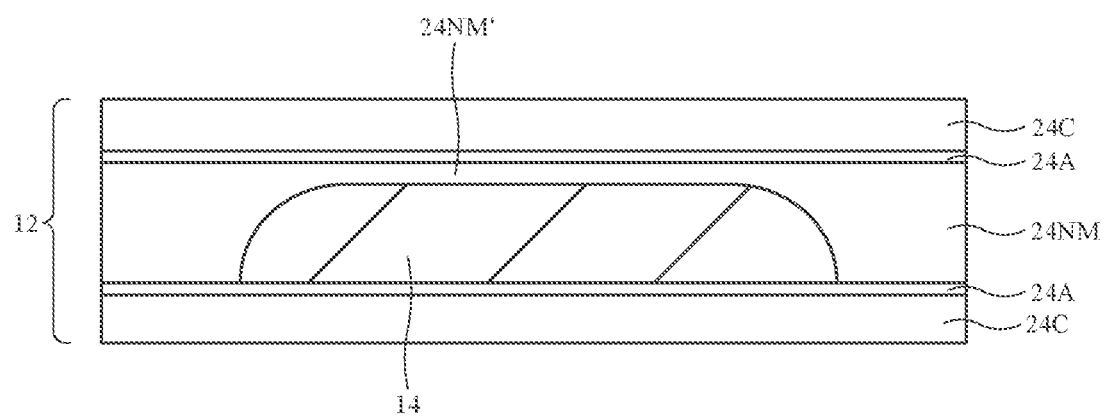
FIGS. 8, 9, and 10 are cross-sectional side views of illustrative layers with embedded magnets in accordance with embodiments.
Figure 9:
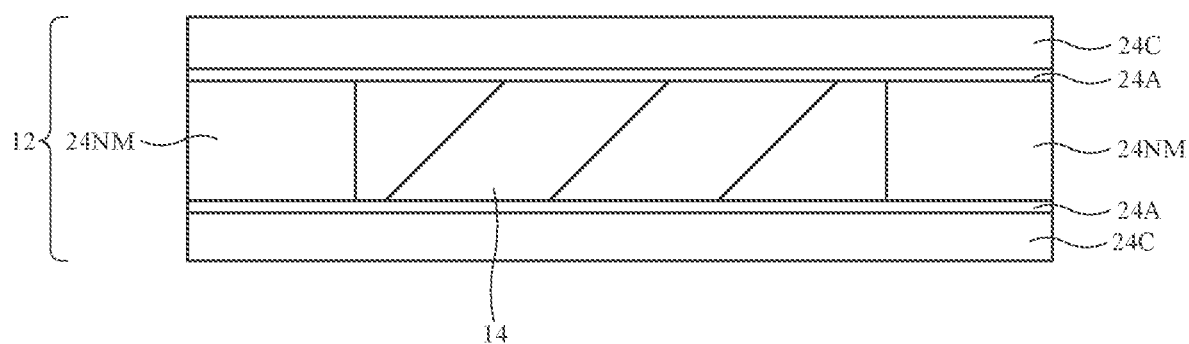
Figure 10:
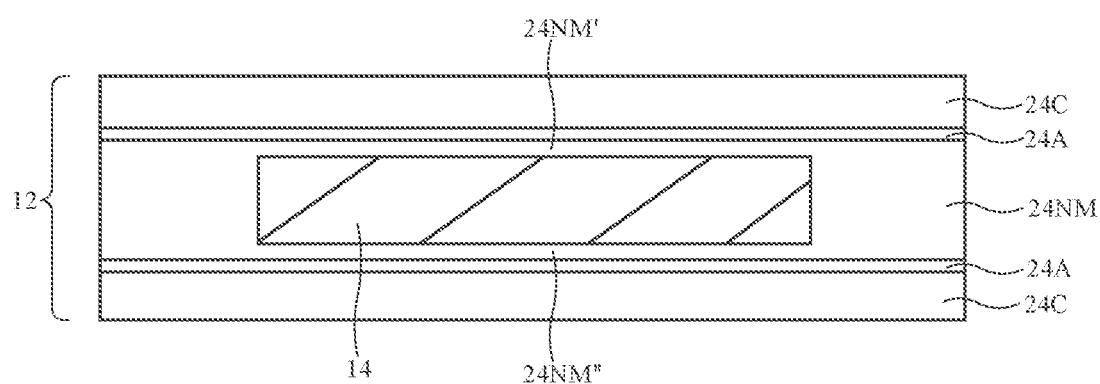

FIGS. 8, 9, and 10 are cross-sectional side views of layer 12 in three respective illustrative configurations. Magnets 14 of layers 12 of FIGS. 8, 9, and 10 may be used in forming a magnetic clasp or other closure for enclosure 10 and/or may be used in forming other magnetic structures.

Magnets 14 may be embedded within co-planar base layer 24NM and covered with one or more covering layers (e.g., cosmetic covering layers) to help visually hide magnets 14 (e.g., so that a user of enclosure 10 does not visually notice magnets 14). As shown in FIG. 8, for example, layer 12 may have outwardly facing covering layers 24C on opposing sides of base layer 24NM and embedded magnets 14. Covering layers 24C, which may sometimes be referred to as outer layers, cosmetic layers, surface layers, external layers, etc., may be attached to the opposing surfaces of layer 24NM by interposed polymer adhesive layers 24A and may form the outermost surface of layer 14.

Covering layers 24C may include materials such as fabric layers, microfiber layers (e.g., microfiber cloth and/or microfibers embedded into the surface of a polymer layer), polymer layers with embedded woven or knit fabric (e.g., elastomeric polymer such as thermoplastic polyurethane into which a knit strengthening fabric has been embedded), metal layers (e.g., solid metal foil or mesh), layers of leather, bonded leather, adhesive layers, other layers, combinations of these layers, etc. The material(s) making up covering layers 24C' may be the same on the inside and outside of enclosure 10 or layer 12 may have a first covering layer (e.g., a covering layer with a smooth polymer exterior surface) on one side of enclosure 10 (e.g., the external side) and an opposing second covering layer that is different than the first covering layer (e.g., a covering layer with a smooth microfiber surface) on an opposing side of enclosure 10 (e.g., the internal side of enclosure 10).

In the arrangement of FIG. 8, which may sometimes be referred to as a one-sided construction, magnet 14 faces towards the lower covering layer 24C and is covered by a thin portion (thin layer 24NM') of layer 24NM. The thickness of layer 24NM' may be 0.2-0.3 mm, at least 0.5 mm, at least 0.1, less than 0.6 mm, less than 0.4 mm, or other suitable thickness. Layer 24NM' is integral with adjacent portions of layer 24NM. The presence of layer 24NM' between magnet 14 and overlapping portions of layer 24C may therefore help ensure that there is no step height difference between the portion of layer 12 over magnet 14 and the remaining portions of layer 12. This may help hide magnet 14.

In the illustrative arrangement of FIG. 9, which may sometimes be referred to as a double-sided construction, layer 24NM' of FIG. 8 is absent. Instead, matrix material 14M of magnet 14 extends without interruption between the inner surfaces of opposing adhesive layers 24A (e.g., the matrix of magnet 14 directly contacts adhesive 24A). In this type of arrangement, layer 24NM and the layer of matrix material forming magnet 14 preferably have the same height (e.g., within 0.05 mm or other suitable tolerance).

Another illustrative arrangement for layer 12 is shown in FIG. 10. In the arrangement of FIG. 10, which may sometimes be referred to as a sandwich construction, magnet 14 faces towards the lower covering layer 24C and is covered on both sides by thin portions of layer 24NM. In particular, there may be a thin layer (layer 24NM') of layer 24NM above magnet 14 and a thin layer (layer 24NM") of layer 24NM below magnet 14. The matrix of magnet 14 is therefore encased on all sides by the material of layer 24NM. The thickness of layers 24NM' and 24NM" may be 0.2-0.3 mm, at least 0.5 mm, at least 0.1, less than 0.6 mm, less than 0.4 mm, or other suitable thickness. The presence of layers 24NM' and 24NM", which are formed as integral portions of layer 24NM, may help hide magnet 14 by reducing or eliminating any step height difference between the portion of layer 12 over magnet 14 and the remaining portions of layer 12.

As described above, one aspect of the present technology is use of an electronic device, which may involve the gathering and use of information such as information from input-output devices. The present disclosure contemplates that in some instances, data may be gathered that includes personal information data that uniquely identifies or can be used to contact or locate a 1o specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is merely illustrative and various modifications can be made to the described embodiments. The foregoing embodiments may be implemented individually or in any combination.

What is claimed is:

1. An enclosure configured to receive an electronic device, comprising:
    a bendable layer that is configured to open and close and that has first and second portions; and
    a magnetic clasp formed from a magnet in the second portion of the bendable layer, wherein the bendable layer comprises a polymer base layer and first and second covering layers, wherein the magnet comprises a flexible magnet embedded in the polymer base layer, wherein the polymer base layer with the embedded flexible magnet is interposed between the first and second covering layers, wherein the second portion of the bendable layer folds about a fold axis and covers the first portion of the bendable layer in a closed state of the enclosure, and wherein the second portion of the bendable layer is unfolded about the fold axis in an open state of the enclosure.

2. The enclosure defined in claim 1 further comprising a first adhesive layer that attaches the first covering layer to a first surface of the polymer base layer with the embedded flexible magnet and a second adhesive layer that attaches the second covering layer to an opposing second surface of the polymer base layer with the embedded flexible magnet.

3. The enclosure defined in claim 2 wherein the embedded flexible magnet is embedded in the polymer base layer using a one-sided construction in which a portion of the polymer base layer extends between the first covering layer and the embedded flexible magnet.

4. The enclosure defined in claim 2 wherein the embedded flexible magnet is embedded in the polymer base layer using a double-sided construction in which the embedded flexible magnet extends uninterrupted between the first and second adhesive layers.

5. The enclosure defined in claim 2 wherein the embedded flexible magnet is embedded in the polymer base layer using a sandwich construction in which a first portion of the polymer base layer extends between the first covering layer and a first surface of the embedded flexible magnet and wherein a second portion of the polymer base layer extends between the second covering layer and an opposing second surface of the embedded flexible magnet.

6. The enclosure defined in claim 1 wherein the flexible magnet comprises a disk-shaped magnet.

7. The enclosure defined in claim 1 wherein the flexible magnet comprises magnetic particles embedded in elastomeric polymer.

8. The enclosure defined in claim 7 wherein the elastomeric polymer comprises nitrile-butadiene rubber.

9. The enclosure defined in claim 1 wherein the flexible magnet has a first durometer value and wherein the polymer base layer has a second durometer value that varies by less than 50% relative to the first durometer value.

10. The enclosure defined in claim 1 wherein the bendable layer has a first thickness overlapping the flexible magnet, wherein the bendable layer exhibits a step height between the first thickness and a second thickness of an adjacent portion of the bendable layer, and wherein the step height is less than 0.05 mm.

11. The enclosure defined in claim 1 wherein the bendable layer is configured to bend about first and second additional fold axes to close over the electronic device.

12. The enclosure defined in claim 1 wherein the polymer base layer with the embedded flexible magnet is attached to the first covering layer and wherein the flexible magnet is hidden from view beneath the first covering layer.

13. The enclosure defined in claim 12 wherein the first covering layer comprises polymer.

14. The enclosure defined in claim 12 wherein the first covering layer comprises a microfiber layer.

15. The enclosure defined in claim 1, wherein the bendable layer has a third portion that folds about an additional fold axis and covers the first portion of the bendable layer in the closed state.

16. The enclosure defined in claim 15, wherein the magnetic clasp is formed from an additional magnet in the third portion of the bendable layer and wherein the magnet in the second portion of the bendable layer is attracted to the additional magnet in the third portion of the bendable layer.

17. The enclosure defined in claim 16, wherein the first portion of the bendable layer is a main portion of the bendable layer, the second portion of the bendable layer is a top portion of the bendable layer, and the third portion of the bendable layer is a left portion of the bendable layer or a right portion of the bendable layer.

18. An enclosure configured to receive an electronic device, comprising:
a bendable layer that is configured to open and close; and
a magnetic clasp formed from a magnet in the bendable layer, wherein the bendable layer comprises a polymer base layer, wherein the magnet comprises a flexible magnet embedded in the polymer base layer, wherein the flexible magnet has a first durometer value, and wherein the polymer base layer has a second durometer value that varies by less than 50% relative to the first durometer value.

19. An enclosure configured to receive an electronic device, comprising:
a bendable layer that is configured to open and close; and
a magnetic clasp formed from a magnet in the bendable layer, wherein the bendable layer comprises a polymer base layer, wherein the magnet comprises a flexible magnet embedded in the polymer base layer, wherein the bendable layer has a first thickness overlapping the flexible magnet, wherein the bendable layer exhibits a step height between the first thickness and a second thickness of an adjacent portion of the bendable layer, and wherein the step height is less than 0.05 mm.

* * * * *